(12) United States Patent
Furuta et al.

(10) Patent No.: US 12,174,502 B2
(45) Date of Patent: Dec. 24, 2024

(54) ACTIVE-MATRIX SUBSTRATE, DISPLAY DEVICE AND TOUCH PANEL

(71) Applicant: Sharp Display Technology Corporation, Kameyama (JP)

(72) Inventors: Shige Furuta, Kameyama (JP); Takahiro Yamaguchi, Kameyama (JP); Kohei Hosoyachi, Kameyama (JP); Yuhichiroh Murakami, Kameyama (JP); Kiyohito Itoh, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 18/419,597

(22) Filed: Jan. 23, 2024

(65) Prior Publication Data

US 2024/0329473 A1   Oct. 3, 2024

(30) Foreign Application Priority Data

Mar. 28, 2023 (JP) .................. 2023-051624

(51) Int. Cl.
*G02F 1/1362* (2006.01)
*G06F 3/041* (2006.01)
*H01L 27/12* (2006.01)

(52) U.S. Cl.
CPC .. *G02F 1/136286* (2013.01); *G02F 1/136254* (2021.01); *G06F 3/0412* (2013.01); *G06F 3/0416* (2013.01); *H01L 27/124* (2013.01)

(58) Field of Classification Search
CPC ......... G02F 1/136286; G02F 1/136254; G06F 3/0412; G06F 3/0416; H01L 27/124
See application file for complete search history.

(56) References Cited

U.S. PATENT DOCUMENTS

| | | | |
|---|---|---|---|
| 2015/0362805 A1* | 12/2015 | Nakagawa | G02F 1/136213 257/71 |
| 2016/0372017 A1* | 12/2016 | Byun | G09G 3/20 |
| 2019/0041711 A1 | 2/2019 | Fujikawa | |
| 2020/0004090 A1* | 1/2020 | Yoshida | G02F 1/1362 |
| 2020/0159053 A1* | 5/2020 | Fujikawa | G02F 1/136286 |
| 2022/0107536 A1* | 4/2022 | Fujikawa | G02F 1/134327 |

FOREIGN PATENT DOCUMENTS

WO   2017/138469 A1   8/2017

* cited by examiner

*Primary Examiner* — Amit Chatly
(74) *Attorney, Agent, or Firm* — Keating & Bennett, LLP (57) ABSTRACT

A touch panel includes a first portion extending in a first direction within a pixel region, a source driving circuit, an inspection circuit, an input terminal region, and an inspection line extending in the first direction within a frame region. The inspection line is formed in a layer different from a layer where the first portion is formed. The inspection line is connected to the first portion and a second portion via a contact hole between a touch-detecting electrode and the source driving circuit. The second portion crosses the source driving circuit and the inspection circuit in a direction intersecting the first direction.

6 Claims, 8 Drawing Sheets

ACTIVE-MATRIX SUBSTRATE, DISPLAY DEVICE AND TOUCH PANEL

BACKGROUND

1. Field

The present disclosure relates to an active-matrix substrate with an inspection circuit and an inspection line connected to the inspection circuit, a display device and a touch panel.

2. Description of the Related Art

International Publication No. 2017/138469 discloses an active-matrix substrate that includes an inspection circuit and an inspection line connected to the inspection circuit.

The active-matrix substrate disclosed in International Publication No. 2017/138469 includes a display region having a split common electrode, a source line, a source driving circuit, an inspection circuit region used to inspect the split common electrode of the display region, a common-electrode line, an input terminal region, and a connection wiring. The source line is connected to the display region. The source driving circuit supplies the source line with a source signal. The common-electrode line connects the inspection circuit region to the split common electrode. The input terminal region includes a terminal supplying the source driving circuit with a control signal and a terminal supplying the common electrode line with an inspection signal. The connection wiring is connected to the common electrode line between the source driving circuit and the inspection circuit region in a plan view. At least a portion of the connection wiring is arranged to overlap the inspection circuit region. An insulating film is arranged between the inspection circuit region and the connection wiring in a portion where the inspection circuit region overlaps the connection wiring.

In the active-matrix substrate disclosed in International Publication No. 2017/138469, an input terminal region is narrower in width than the display region in a direction perpendicular to an extension direction of the source line. For this reason, a subset of the multiple connection wirings is formed such that the subset extends to the source driving circuit in a direction intersecting the extension direction of the source line in an outer edge portion of the active-matrix substrate. For example, the connection wiring is formed to extend in a direction substantially perpendicular to the extension direction of the source line. Since one connection wiring is spaced from another adjacent connection wiring to assure insulation therebetween, an area of the connection wirings is typically enlarged in the extension direction of the source line. This also leads to an enlargement in a frame region of the active-matrix substrate.

It is desirable to provide an active-matrix substrate, a display device, and a touch panel featuring a smaller frame region even when a source driving circuit and an inspection circuit are disposed.

SUMMARY

According to a first aspect of the disclosure, there is provided an active-matrix substrate including: a plurality of pixel electrodes arranged within a pixel region; a plurality of pixel transistors arranged within the pixel region; a plurality of source lines extending in a first direction within the pixel region with one of the source lines connected to one of the pixel transistors; a source driving circuit arranged within a frame region and supplying the source lines with a source signal; a plurality of counter electrodes overlapping at least one of the pixel electrodes in a plan view; a plurality of counter-electrode lines having a first portion extending in the first direction within the pixel region with one of the counter-electrode lines connected to one of the counter electrodes; a signal input region arranged within the frame region, supplying the counter-electrode lines with a counter-electrode driving signal and supplying the source driving circuit with a control signal; an inspection circuit arranged within the frame region and outputting an inspection signal used to inspect the counter electrodes; and a plurality of inspection lines connected to the inspection circuit and extending in the first direction within the frame region, wherein the source driving circuit and the inspection circuit are arranged between the counter electrodes and the signal input region, wherein the inspection lines are formed in a layer different from a layer where the counter-electrode lines are formed, wherein each of the inspection lines is connected to one of the counter-electrode lines via a contact hole between the counter electrode and the source driving circuit, wherein each of the counter-electrode lines has a second portion extending in a second direction intersecting the first direction from the contact hole to the signal input region within the frame region, and wherein the second portion crosses the source driving circuit and the inspection circuit in the second direction in a plan view.

According to a second aspect of the disclosure, there is provided a display device including: the active-matrix substrate according to the first aspect of the disclosure; and a counter substrate arranged opposite to the active-matrix substrate.

According to a third aspect of the disclosure, there is provided a touch panel including: a plurality of pixel electrodes arranged within a pixel region; a plurality of pixel transistors arranged within the pixel region; a plurality of source lines extending in a first direction within the pixel region with one of the source lines connected to one of the pixel transistors; a source driving circuit arranged within a frame region and supplying the source lines with a source signal; a plurality of touch-detecting electrodes overlapping at least one of the pixel electrodes in a plan view; a plurality of touch-detecting electrode lines having a first portion extending in the first direction within the pixel region with one of the touch-detecting electrode lines connected to one of the touch-detecting electrodes; a signal input region arranged within the frame region, supplying the touch-detecting electrode lines with a touch driving signal and supplying the source driving circuit with a control signal; an inspection circuit arranged within the frame region and outputting an inspection signal used to inspect the touch-detecting electrodes; and a plurality of inspection lines connected to the inspection circuit and extending in the first direction within the frame region, wherein the source driving circuit and the inspection circuit are arranged between the counter electrodes and the signal input region, wherein the inspection lines are formed in a layer different from a layer where the touch-detecting electrode lines are formed, wherein each of the inspection lines is connected to one of the touch-detecting electrode lines via a contact hole between the touch-detecting electrode and the source driving circuit, wherein each of the touch-detecting electrode lines has a second portion extending in a second direction intersecting the first direction from the contact hole to the signal input region within the frame region, and wherein the second portion crosses the source driving circuit and the inspection circuit in the second direction in a plan view.

DESCRIPTION OF THE EMBODIMENTS

Embodiments of the disclosure are described with reference to the drawings. Identical or equivalent elements are designated with the same reference numerals and the discussion thereof is not repeated. For convenience of explanation, the configurations may be simplified or clarified in the drawings, and some of components in each configuration may be omitted. The components in the drawings are not necessarily drawn according to the actual dimensional ratio.

First Embodiment

Whole Configuration of Touch-Panel Display Device

Figure 1:
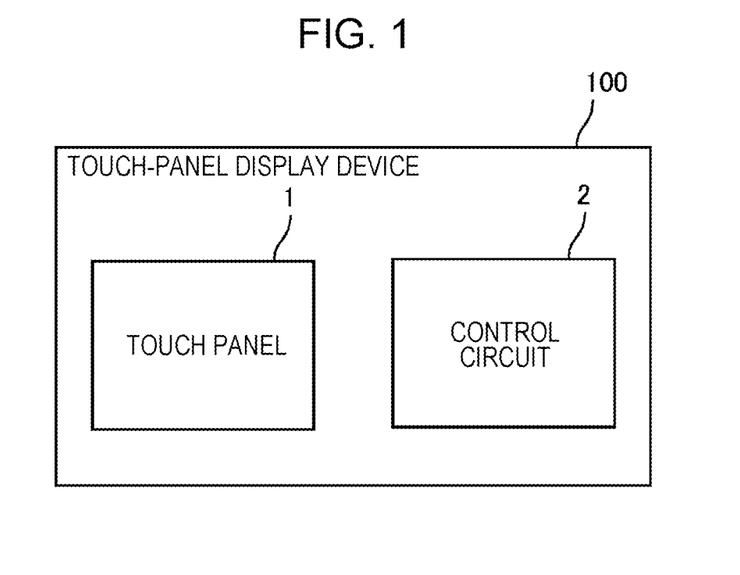
FIG. 1 is a block diagram illustrating the configuration of a touch-panel display device of a first embodiment.
Figure 2:
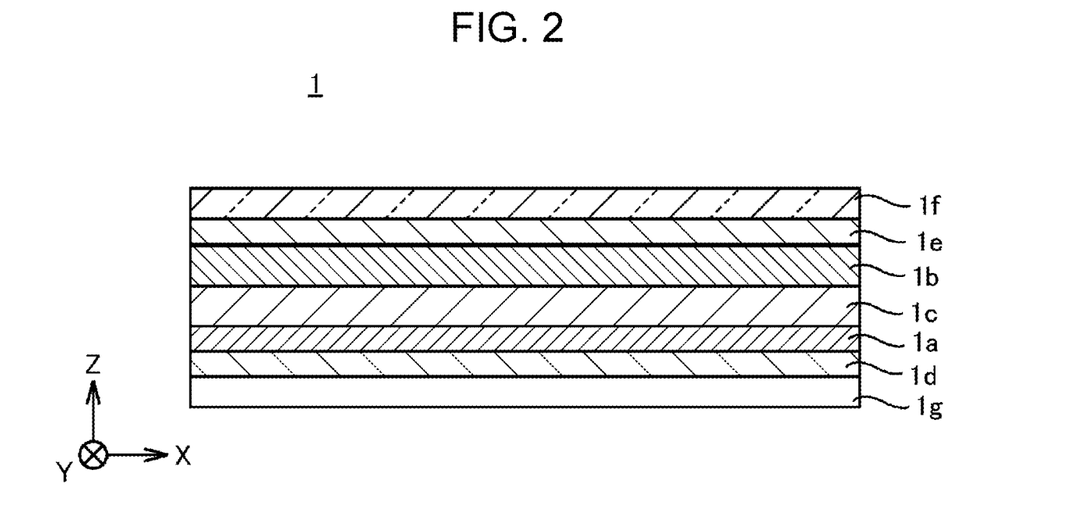
FIG. 2 is a cross-sectional view illustrating a touch panel of the first embodiment.

The configuration of the touch-panel display device 100 (hereinafter simply referred to as a "display device 100") of a first embodiment is described below. FIG. 1 is a block diagram illustrating the configuration of the display device 100 of the first embodiment. FIG. 2 is a cross-sectional view illustrating the basic configuration of a touch panel 1 of the display device 100.

Referring to FIG. 1, the display device 100 includes the touch panel 1 and control circuit 2. The touch panel 1 detects a touch caused by a pointer (a finger or a pen). For example, the touch panel 1 is an in-cell touch panel. The touch panel 1 displays an image or a video in response to a control signal from the control circuit 2. The control circuit 2 outputs the control signal to the touch panel 1 and controls the operation of the touch panel 1. The control circuit 2 acquires detection results from the touch panel 1 and controls the operation of the display device 100. The control circuit 2 also acquires detection results of touch and control the operation of the display device 100 in response to the detection results.

Referring to FIG. 2, the touch panel 1 includes a first substrate 1a, a second substrate 1b, and a liquid-crystal layer 1c. The first substrate 1a is an active-matrix substrate. The second substrate 1b is a counter substrate facing the first substrate 1a. The liquid-crystal layer 1c is interposed between the first substrate 1a and the second substrate 1b. Specifically, the liquid-crystal layer 1c is sandwiched between the first substrate 1a and the second substrate 1b.

The touch panel 1 further includes a pair of polarizers 1d and 1e such that the polarizers 1d and 1e sandwich the first substrate 1a and the second substrate 1b. For example, cover glass 1f is disposed on the surface of the polarizer 1e and backlight 1g is disposed on the polarizer 1d. The second substrate 1b includes three color filters of red (R), green (G), and blue (B) (not illustrated).

Figure 3:
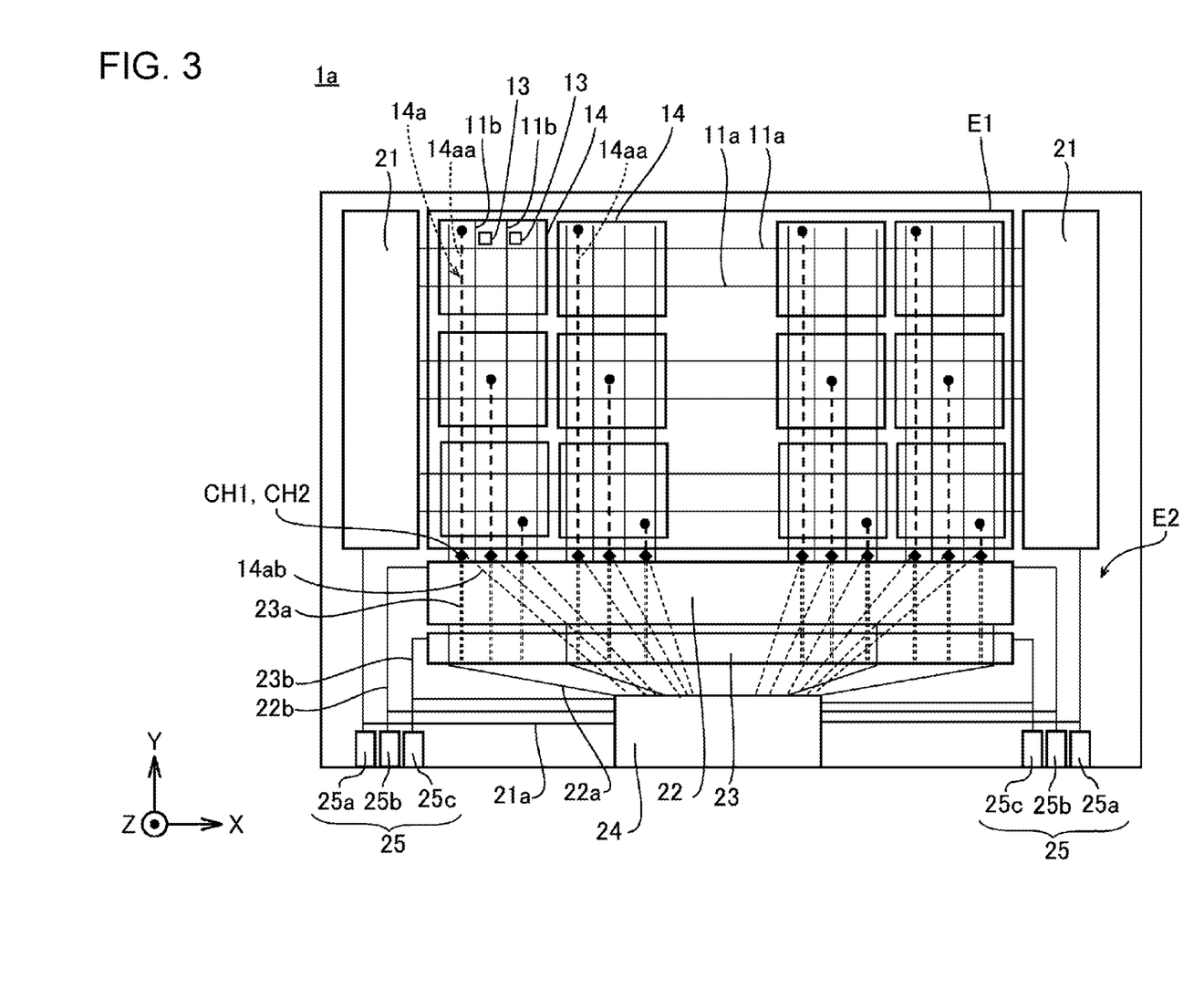
FIG. 3 is a schematic plan view illustrating the configuration of a first substrate.

FIG. 3 is a schematic plan view illustrating the configuration of the first substrate 1a. The first substrate 1a includes multiple gate lines 11a, multiple source lines 11b, two gate driving circuits 21, a source driving circuit 22, an inspection circuit 23, an input terminal region 24, and an inspection terminal region 25. The two gate driving circuits 21 are arranged within a frame region E2 such that a pixel region E1 is interposed between the two gate driving circuits 21. The source driving circuit 22, the inspection circuit 23, and the input terminal region 24 are arranged within the frame region E2 in this order from the side of the pixel region E1. In other words, the input terminal region 24, the inspection circuit 23, the source driving circuit 22, and the pixel region E1 are arranged in this order from the outer edge of the first substrate 1a. In the frame region E2, one inspection terminal region 25 is arranged in an X direction from the input terminal region 24 and the other input terminal region 24 is arranged in a direction inverse to the X direction from the input terminal region 24. The "pixel region E1" is a region where at least one of the pixel electrode 13 or touch-detecting electrode 14 is arranged. The "frame region E2" is a region that is outside the pixel region E1 and does not contribute to displaying.

The gate lines 11a and source lines 11b are arranged in a grid on the first substrate 1a. The gate lines 11a are connected to the two gate driving circuits 21. The gate lines 11a extend in an X direction between the two gate driving circuits 21. The source lines 11b are connected to the source driving circuit 22. The source lines 11b extend in a Y direction from the source driving circuit 22. The pixel electrode 13 is disposed in each region delineated by the gate line 11a and the source line 11b. A region having the pixel electrodes 13 forms the pixel region E1 displaying a video (display region). Each pixel electrode 13 is disposed correspondingly to one of the R, G, and B color filters arranged on the second substrate 1b.

Figure 4:
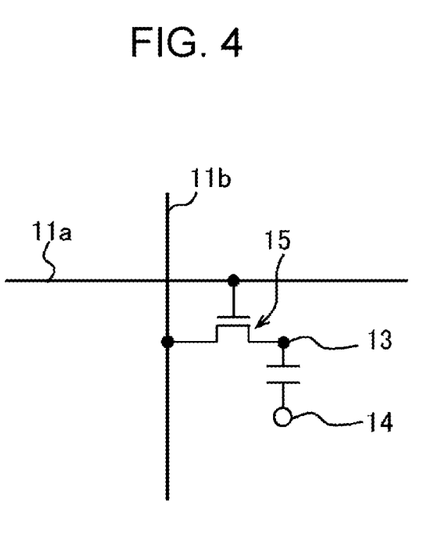
FIG. 4 is a circuit diagram illustrating the configuration of a pixel transistor.

FIG. 4 is a circuit diagram of a region delineated by the gate line 11a and the source line 11b. The delineated region includes the pixel electrode 13, touch-detecting electrode 14, and pixel transistor 15.

The gate electrode of the pixel transistor 15 is connected to the gate line 11a, the source electrode of the pixel transistor 15 is connected to the source line 11b, and the drain electrode of the pixel transistor 15 is connected to the pixel electrode 13. The driving method of liquid-crystal molecules contained in the liquid-crystal layer 1c is a transverse electric field driving method.

The touch-detecting electrode 14 is disposed to the side of the liquid-crystal layer 1c with respect to the pixel electrode 13 in the first substrate 1a and is arranged opposite to multiple pixel electrodes 13. Specifically, the touch-detecting electrode 14 is a counter electrode overlapping on the pixel electrodes 13 in a plan view. The touch-detecting electrode 14 is also disposed common to the pixel electrodes 13 and serves as a common electrode in the first substrate 1a (active-matrix substrate). The first substrate 1a includes multiple touch-detecting electrode lines 14a connected to each of the touch-detecting electrodes 14. Each of the touch-detecting electrode lines 14a includes a first portion 14aa and a second portion 14ab. The first portion 14aa is connected to one of the touch-detecting electrodes 14. The first portion 14aa extends in parallel with an extension direction of the source line 11b (Y direction). The touch-detecting electrode line 14a is a counter-electrode line (common-electrode line) connected to the touch-detecting electrode 14 that functions as a counter electrode (common electrode). The touch-detecting electrode 14 forms a capacitance with a pointer (such as a finger or a pen) that is in touch with the touch panel 1. The touch-detecting electrode 14 is supplied with a touch driving signal by the input terminal region 24 and the waveform of the touch driving signal varies in accordance with the magnitude of the capacitance with the pointer. The control circuit 2 receives a varied touch driving signal as a touch detection signal and thus detects a touch operation in response to the touch detection signal.

The first substrate 1a includes inspection lines 23a. The inspection line 23a is connected to the first portion 14aa and the second portion 14ab of the touch-detecting electrode line 14a via contact holes CH1 and CH2. According to the first embodiment, the inspection line 23a is connected to the first portion 14aa and the second portion 14ab via the contact holes CH1 and CH2 between the touch-detecting electrode 14 (the pixel region E1) and the source driving circuit 22. In other words, the first portion 14aa branches to the second portion 14ab and the inspection line 23a between the touch-detecting electrode 14 (the pixel region E1) and the source driving circuit 22.

An integrated circuit (the control circuit 2) is mounted (arranged) on the input terminal region 24 using chip on glass (COG) technique or chip on film (COF) technique. It is noted that the first substrate 1a is inspected with the integrated circuit (the control circuit 2) not mounted on the input terminal region 24. A flexible printed circuit or a signal line may be connected to the input terminal region 24 rather than mounting the integrated circuit on the input terminal region 24 and the input terminal region 24 may be connected to the control circuit 2 via the flexible printed circuit or the signal line. The input terminal region 24 is supplied with a control signal by the control circuit 2. The input terminal region 24 is connected to the second portion 14ab, and wirings 21a and 22a. The input terminal region 24 supplies the gate driving circuit 21 with a control signal via the wiring 21a. The input terminal region 24 supplies the source driving circuit 22 with a control signal via the wiring 22a. The input terminal region 24 supplies the touch-detecting electrode 14 with the touch driving signal via the second portion 14ab. The input terminal region 24 receives the touch detection signal from the touch-detecting electrode 14 via the second portion 14ab.

The inspection terminal region 25 includes inspection terminals 25a, 25b, and 25c. When the first substrate 1a is inspected during or after manufacturing, a voltage (inspection signal) is input to the inspection terminals 25a, 25b, and 25c from an inspection device (not illustrated). The inspection terminal 25a is connected to the wiring 21a. The inspection terminal 25a supplies the gate driving circuit 21 with an inspection signal (signal inspecting the gate driving circuit 21 and the gate line 11a) via the wiring 21a. The first substrate 1a includes wirings 22b and 23b. The inspection terminal 25b is connected to the wiring 22b. The inspection terminal 25b supplies the source driving circuit 22 with an inspection signal (signal inspecting the source driving circuit 22 and the source line 11b) via the wiring 22b. The inspection terminal 25c supplies the inspection circuit 23 with an inspection signal (signal inspecting the touch-detecting electrode 14 and the first portion 14aa) via the wiring 23b.

The gate driving circuit 21 includes a shift register (not illustrated) connected to the gate line 11a. The shift register supplies each gate line 11a with a gate signal that causes the gate line 11a to be switched between a selected state and a non-selected state in response to the control signal supplied from the control circuit 2. In response to the control signal from the control circuit 2, the source driving circuit 22 applies, to each source line 11b, a source signal (voltage) used to display an image. The control circuit 2 performs a time-division operation by switching between a time duration while the control circuit 2 causes the touch panel 1 to display an image by supplying the gate driving circuit 21 and the source driving circuit 22 with the control signal and a time duration while the control circuit 2 detects a touch by supplying the touch-detecting electrode 14 with a touch driving signal.

Detailed Configuration of Source Driving Circuit and Inspection Circuit

Figure 5:
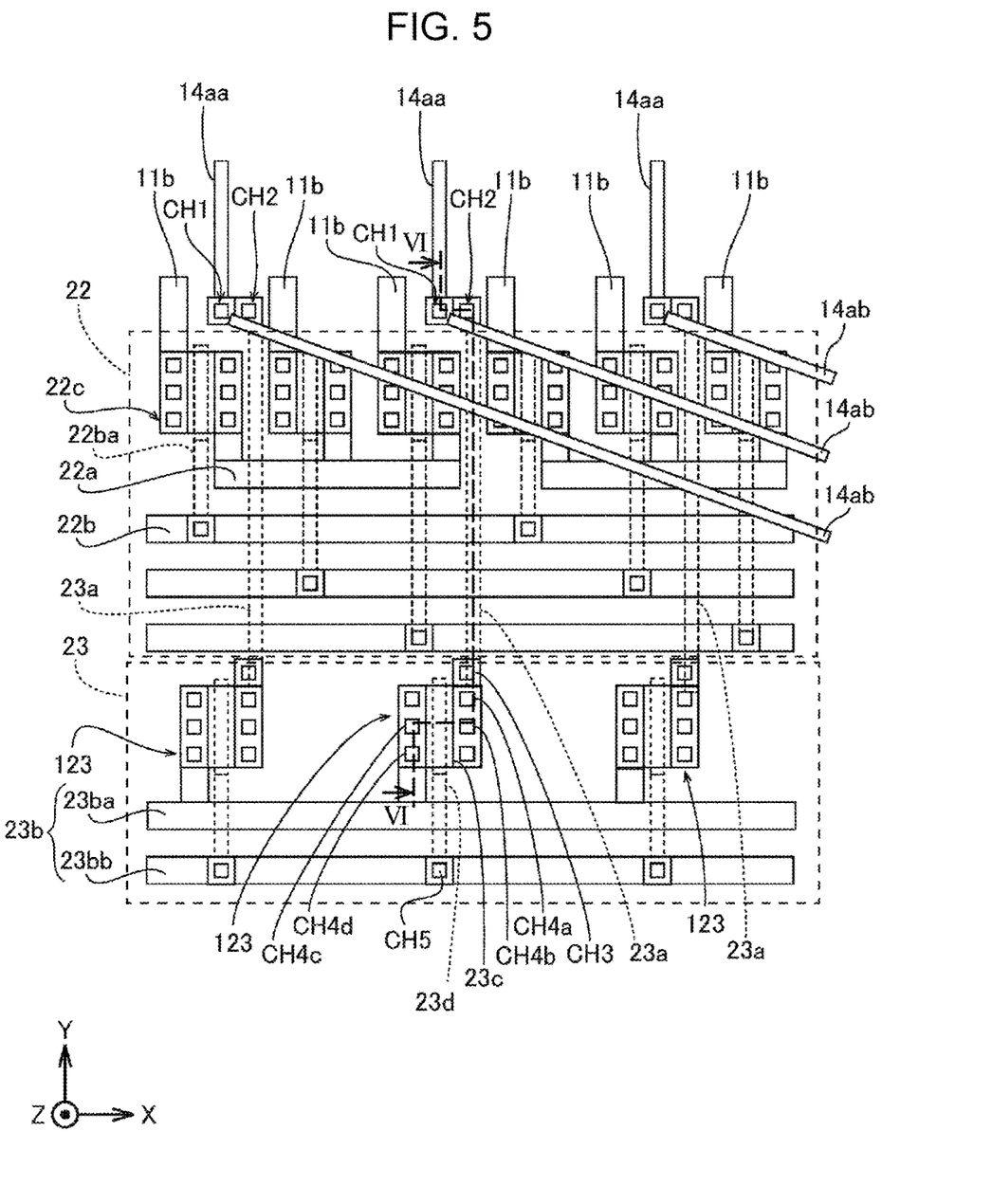
FIG. 5 is a schematic plan view illustrating the configuration of a source driving circuit and an inspection circuit.
Figure 6:
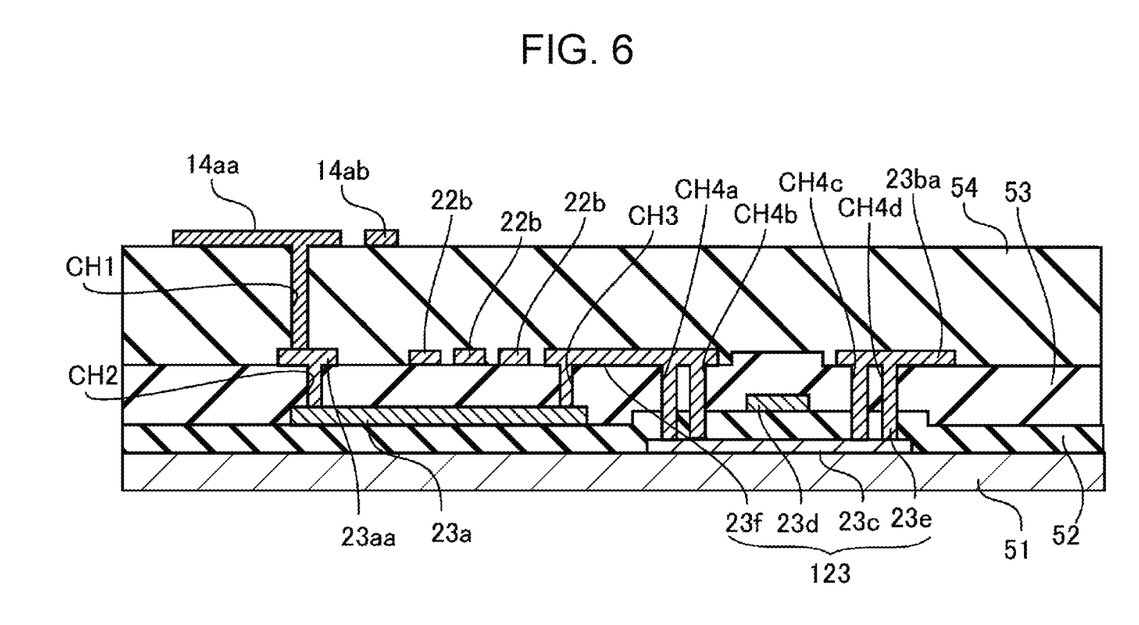
FIG. 6 is a cross-sectional view illustrating the configuration of an inspection line and the inspection circuit.

FIG. 5 is a schematic plan view illustrating the configuration of the source driving circuit 22 and the inspection circuit 23. FIG. 6 is a cross-sectional view illustrating the configuration of the inspection circuit 23. As illustrated in FIG. 5, the source driving circuit 22 is a monolithic integrated circuit that is formed by laminating a conductive film and an insulating film on the first substrate 1a (substrate 51). The source driving circuit 22 includes multiple transistors 22c. FIG. 5 illustrates an example of the source driving circuit 22 including a demultiplexer having one input and three outputs. The transistor 22c is connected to a wiring 22ba and a wiring 22b. The drain electrode of the transistor 22c is connected to the source line 11b and the source electrode of the transistor 22c is connected to a wiring 22a. The gate electrode of the transistor 22c is connected to the wiring 22b via the wiring 22ba. When the gate electrode of the transistor 22c is supplied with the control signal, the transistor 22c turns on, thereby supplying the source line 11b with a voltage (source signal) applied to the wiring 22a.

The inspection circuit 23 is a monolithic integrated circuit that is formed by laminating a conductive film and an insulating film on the first substrate 1a. Referring to FIG. 5, the inspection circuit 23 includes thin-film transistors 123. The gate electrode 23d of the thin-film transistor 123 is connected to a control signal line 23bb of the wiring 23b via a contact hole CH5. Referring to FIG. 6, the source electrode 23e of the thin-film transistor 123 is connected to the inspection signal line 23ba of the wiring 23b. The drain electrode 23f of the thin-film transistor 123 is connected to the inspection line 23a. The source electrode 23e and the drain electrode 23f are connected to the semiconductor layer 23c of the thin-film transistor 123 via contact holes CH4a through CH4d. When the control signal line 23bb is supplied with the control signal by the inspection terminal region 25 with the inspection signal line 23ba supplied with the inspection signal, the thin-film transistor 123 turns on, supplying the inspection line 23a with the inspection signal. Since the inspection line 23a is connected to the first portion 14aa, the inspection signal is supplied to the touch-detecting electrode 14 via an inspection line 23a and the first portion 14aa. The inspection device (not illustrated) connected to the inspection terminal region 25 receives a signal from the touch-detecting electrode 14 when the inspection signal is supplied and the inspection device determines in response to received results whether the touch-detecting electrode 14 has been successfully inspected. For example, if the touch-detecting electrode 14 is short-circuited to another electrode within the display region (the pixel region E1), a potential difference occurs between the inspection signal supplied to the inspection signal line 23ba and the received signal and the inspection device detects an abnormal current, thus detecting a short-circuit defect. The inspection circuit, inspection lines, and inspection signals are arranged such that multiple adjacent touch-detecting electrodes 14 are supplied with different potentials. A short-circuit defect, if occurred, may thus be detected between the mutually adjacent touch-detecting electrodes 14.

The thin-film transistor 123 is formed in the same layer as the layer where the pixel transistor 15 is formed. Specifically, the semiconductor layer 23c of the thin-film transistor 123 is formed in the same layer as the layer where the semiconductor layer of the pixel transistor 15 is formed. In other words, the semiconductor layer 23c of the thin-film transistor 123 and the semiconductor layer of the pixel transistor 15 are formed on the substrate 51. These semiconductor layers are covered with an insulating film 52. The gate electrode 23d of the thin-film transistor 123 is formed in the same layer as the layer where the gate electrode of the pixel transistor 15 is formed. Specifically, the gate electrode 23d of the thin-film transistor 123 and the gate electrode of the pixel transistor 15 are formed on the insulating film 52. These gate electrodes are covered with an insulating film 53. The source electrode 23e and the drain electrode 23f of the thin-film transistor 123 and the source electrode and the drain electrode of the pixel transistor 15 are disposed on the insulating film 53. An insulating film 54 is disposed on the first substrate 1a to cover the source electrode and the drain electrode. The first portion 14aa and the second portion 14ab are formed on the insulating film 54.

Referring to FIG. 6, the inspection line 23a is formed in the same layer as the layer where the gate electrode 23d of the thin-film transistor 123 is formed. Specifically, the inspection line 23a is formed on the insulating film 52 and covered with the insulating film 53. The inspection line 23a is connected to the thin-film transistor 123 within a contact hole CH3. The inspection line 23a is connected to the first portion 14aa through the insulating films 53 and 54. The first substrate 1a includes the connection electrode 23aa that connects the inspection line 23a and the first portion 14aa. The connection electrode 23aa is formed on the insulating film 53 and is formed in the same layer as the layer where the wiring 22b and the wiring 23b are formed. The connection electrode 23aa is connected to the first portion 14aa within the contact hole CH1.

Referring to FIG. 3, the second portion 14ab extends in a direction intersecting the Y direction from the contact holes CH1 and CH2 to the input terminal region 24. The second portion 14ab further crosses the source driving circuit 22 and the inspection circuit 23 in the direction intersecting the Y direction. In other words, the second portion 14ab is arranged to overlap the source driving circuit 22 and the inspection circuit 23 in a plan view rather than circumventing the source driving circuit 22 and the inspection circuit 23. A smaller intersection angle may result between the direction extending from the contact holes CH1 and CH2 to the input terminal region 24 and the Y direction than when contact holes are disposed on an external edge portion outside the source driving circuit and the counter-electrode line or the touch-detecting electrode line 14a is formed from the contact holes to a signal input region. As a result, an increase in an area having the second portions 14ab arranged thereon in the extension direction of the source line 11b (Y direction) may be controlled if one second portion 14ab is spaced from adjacent second portion 14ab. The frame region E2 may thus be decreased in size even when the source driving circuit 22 and the inspection circuit 23 are disposed on the first substrate 1a.

Second Embodiment

The configuration of the touch-panel display device 200 (hereinafter referred to as a "display device 200") of a second embodiment is described with reference to FIGS. 7 through 9. In the display device 200 of the second embodiment, a touch panel 201 includes swap lines 231 and 232 and a second portion 214ab is arranged to be overlapped on the swap lines 231 and 232 in a plan view. In the following discussion, elements of the second embodiment respectively identical to those of the first embodiment are designated with the same reference numerals and the discussion thereof remain unchanged unless otherwise particularly noted.

Figure 7:
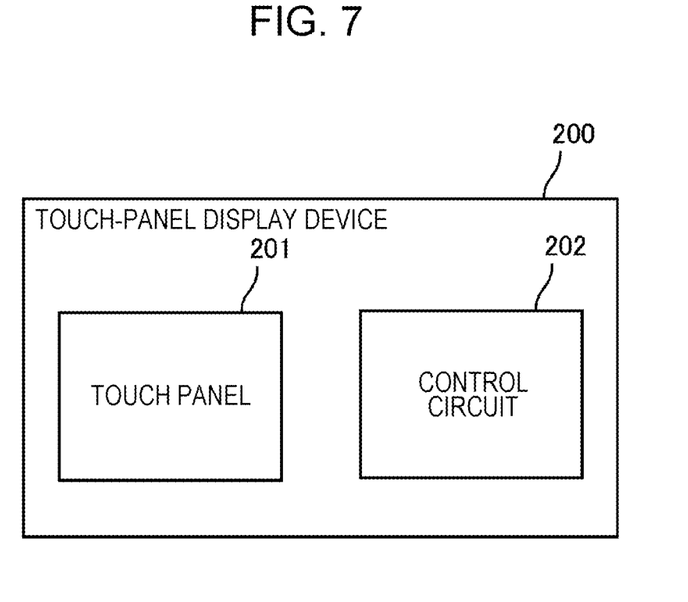
FIG. 7 is a block diagram illustrating the configuration of a touch-panel display device according to a second embodiment.
Figure 8:
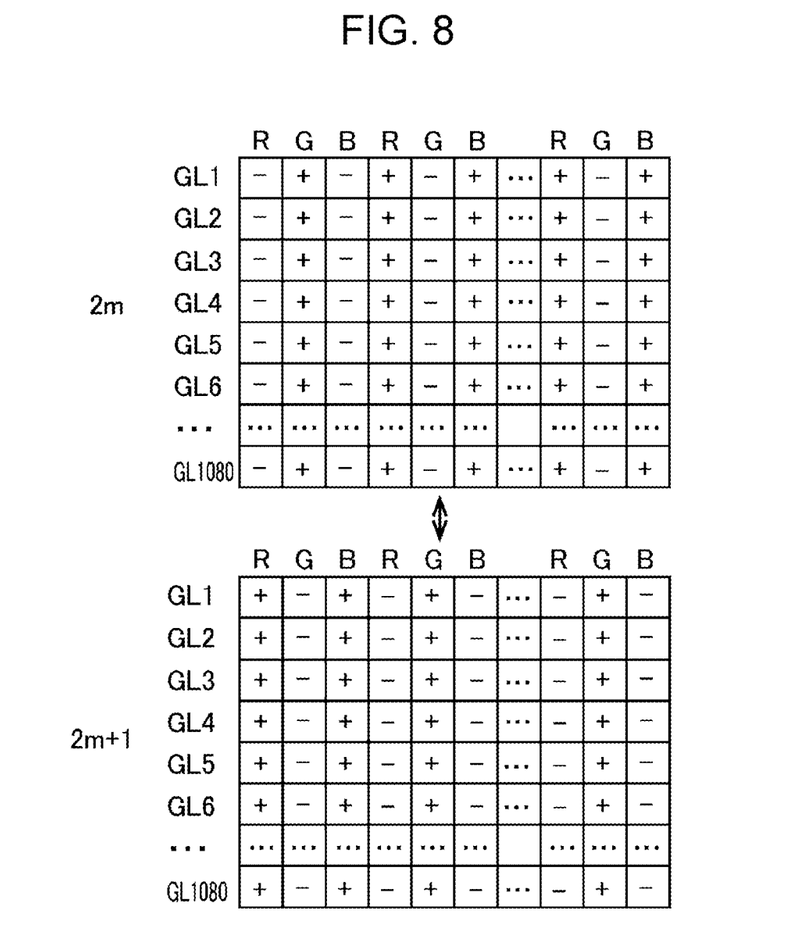
FIG. 8 illustrates a column reversal driving operation according to the second embodiment.

FIG. 7 is a block diagram illustrating the display device 200 of the second embodiment. Referring to FIG. 7, the display device 200 includes the touch panel 201 and control circuit 202. As illustrated in FIG. 8, the control circuit 202 performs a column reversal driving operation on the pixel electrodes 13 (see FIG. 3) of the touch panel 201. For example, m is a natural number and the pixel electrodes 13 supplied with a positive (+) voltage (source signal) in a 2m-th frame (even-numbered frame) are supplied with a negative (−) voltage (source signal) in a (2m+1)-th frame (odd-numbered frame). Two adjacent pixel electrodes 13 in the extension direction of the gate line 11a are supplied with mutually different polarity voltages (source signals).

Figure 9:
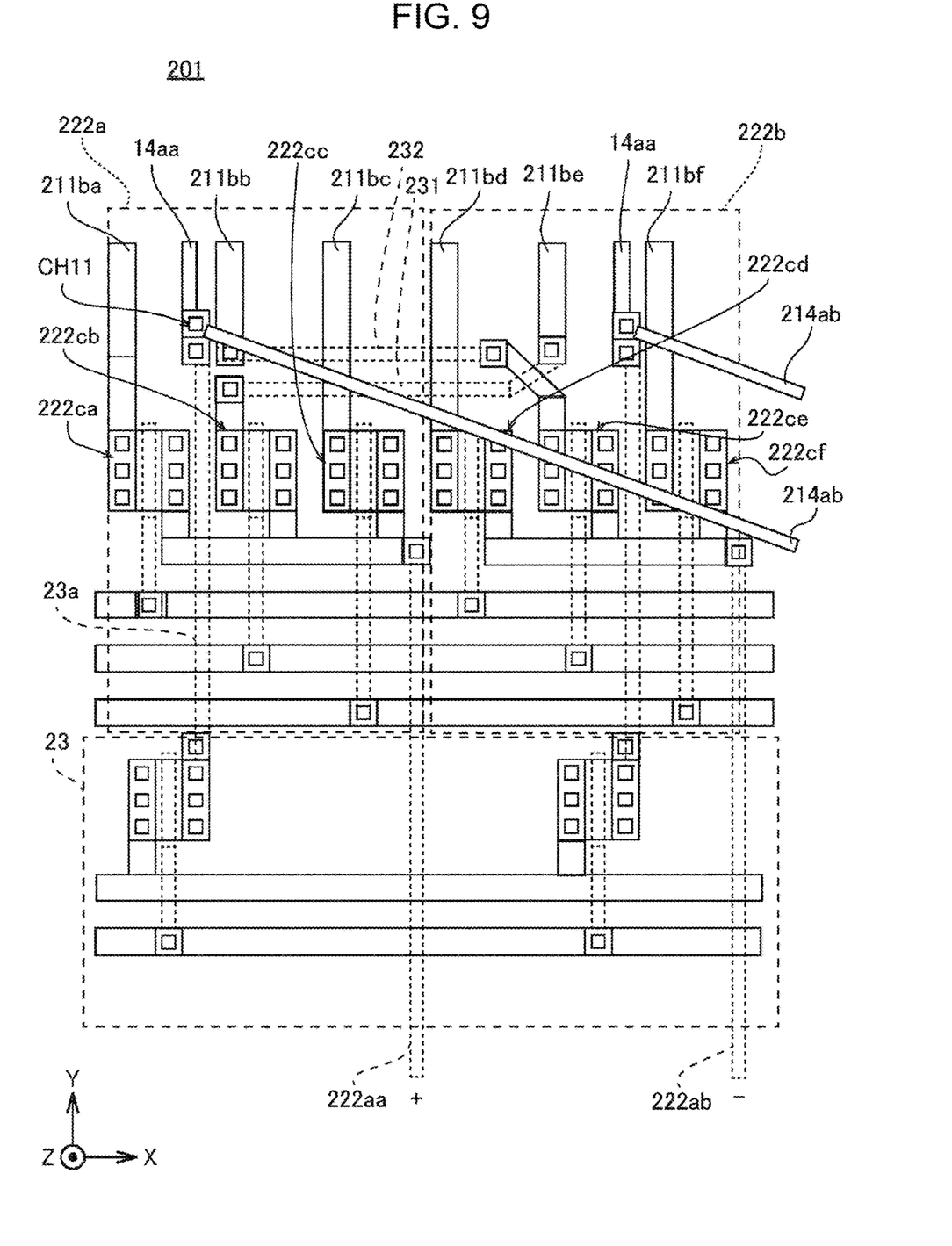
FIG. 9 is a schematic plan view illustrating the configuration of a first source driving circuit and a second source driving circuit according to the second embodiment.

Referring to FIG. 9, the touch panel 201 includes a first source driving circuit 222a and a second source driving circuit 222b. The first source driving circuit 222a and the second source driving circuit 222b are arranged side by side in an X direction. The touch panel 201 may include another source driving circuit (not illustrated in FIG. 9) other than the first source driving circuit 222a and the second source driving circuit 222b. Each of the first source driving circuit 222a and the second source driving circuit 222b is a monolithic integrated circuit formed in the touch panel 201. Each of the first source driving circuit 222a and the second source driving circuit 222b includes multiple transistors. FIG. 9 illustrates an example of the first source driving circuit 222a and the second source driving circuit 222b, each of which includes a demultiplexer having a single input and three outputs. The first source driving circuit 222a includes transistors 222ca through 222cc supplied with a voltage (source signal) of a first polarity (positive (+) polarity in FIG. 9). The transistors 222ca through 222cc are supplied with a source signal having the first polarity from an input terminal region (not illustrated) via a wiring 222aa. The second source driving circuit 222b includes transistors 222cd through 222cf supplied with a voltage (source signal) having a second polarity (negative (−) polarity in FIG. 9). The transistors 222cd through 222cf are supplied with a voltage having the second polarity via a wiring 222ab from the input terminal region (not illustrated). The first polarity and the second polarity are alternated every frame.

The touch panel 201 includes source lines 211ba through 211bf arranged side by side. The source lines 211ba through 211bc are arranged in the second source driving circuit 222b (on the right-hand side of the page of FIG. 9) in the X direction. The source lines 211bd through 211bf are arranged in the second source driving circuit 222b (on the left-hand side of the page of FIG. 9) in the X direction. In the second embodiment, the first source driving circuit 222a and the second source driving circuit 222b include a swap line 232 connecting a source line 211*bb* to a transistor 222*ce* and a swap line 231 connecting a source line 211*be* to a transistor 222*cb*. The "swap line" is a wiring that connects a source line not to a transistor arranged in the extension direction of the source line but to another transistor that outputs a source signal different in polarity from the source signal output by the transistor. The swap line 231 connects the source line 211*be* not to the transistor 222*ce* arranged in the extension direction of the source line 211*be* but to the transistor 222*cb* that outputs the source signal having the positive (+) polarity different from the negative (−) polarity of the source signal output by the transistor 222*ce*. The swap line 232 connects the source line 211*bb* not to the transistor 222*cb* arranged in the extension direction of the source line 211*bb* but to the transistor 222*ce* that outputs the source signal having the negative (−) polarity different from the positive (+) polarity of the source signal output by the transistor 222*cb*. In the case of a source driving circuit having a single input wiring and three output wirings (source lines), the center source line of the three output wirings is connected to the swap line.

A source signal having the second polarity is output to the source line 211*bb* while a source signal having the first polarity is output to the source line 211*be*. Referring to FIG. 8, multiple pixel electrodes 13 adjacent to each other in the extension direction of the gate line 11*a* are supplied with voltages (source signals) having mutually different polarities. If each of the source driving circuits 222*a* and 222*b* includes a demultiplexer having one input and three outputs, the swap lines 231 and 232 may cause the touch panel 201 to perform the column reversal driving operation.

The swap lines 231 and 232 are formed in the same layer as the layer where the inspection lines 23*a* are formed. If the inspection lines 23*a* are formed in the touch panel 201 having the swap lines 231 and 232, the number of layers does not increase. The first portion 14*aa* branches at a contact hole CH11 to the second portion 214*ab* and the inspection line 23*a*. The second portion 214*ab* is formed in the same layer as the layer where the first portion 14*aa* is formed. The inspection line 23*a* is formed in a layer below the second portion 214*ab*. In other words, the swap lines 231 and 232 are formed in a layer (lower layer) different from the layer where the first portion 14*aa* and the second portion 214*ab* are formed. Referring to FIG. 9, at least part of the second portion 214*ab* overlaps the swap lines 231 and 232 in a plan view. In this way, a region (frame region) where the second portion 214*ab* and the swap lines 231 and 232 are arranged may be set to be smaller than when the whole second portion 214*ab* is arranged to be non-overlapped on the swap lines 231 and 232. The rest of the configuration and effect of the second embodiment remains unchanged from the first embodiment.

Modifications

The embodiments have been described for exemplary purposes only. The disclosure is not limited to the embodiments described above and the embodiments may be modified without departing from the scope of the disclosure.

(1) The first and second embodiments include the touch-panel display device. The disclosure is not limited to this configuration. The technique of the disclosure may be applied to a display device without a touch panel.

(2) According to the first and second embodiments, the source driving circuit includes the demultiplexer providing three outputs in response to one input. The disclosure is not limited to this configuration. The source driving circuit may be configured to provide one output in response to one input.

(3) According to the first and second embodiments, the inspection transistor of the inspection circuit is formed in the same layer as the layer where the pixel transistor is formed. The disclosure is not limited to this configuration. The inspection transistor of the inspection circuit may be formed in a layer different from the layer where the pixel transistor is formed.

(4) According to the first and second embodiments, the inspection circuit includes the inspection transistor. The disclosure is not limited to this configuration. The inspection terminal may be connected to the inspection line without arranging the inspection transistor in the inspection circuit.

The configurations described above may also be described as below.

An active-matrix substrate according to a first configuration includes a plurality of pixel electrodes arranged within a pixel region; a plurality of pixel transistors arranged within the pixel region; a plurality of source lines extending in a first direction within the pixel region with one of the source lines connected to one of the pixel transistors; a source driving circuit arranged within a frame region and supplying the source lines with a source signal; a plurality of counter electrodes overlapping at least one of the pixel electrodes in a plan view; a plurality of counter-electrode lines having a first portion extending in the first direction within the pixel region with one of the counter-electrode lines connected to one of the counter electrodes; a signal input region arranged within the frame region, supplying the counter-electrode lines with a counter-electrode driving signal, and supplying the source driving circuit with a control signal; an inspection circuit arranged within the frame region and outputting an inspection signal used to inspect the counter electrodes; and a plurality of inspection lines connected to the inspection circuit and extending in the first direction within the frame region. The source driving circuit and the inspection circuit are arranged between the counter electrodes and the signal input region. The inspection lines are formed in a layer different from a layer where the counter-electrode lines are formed. Each of the inspection lines is connected to one of the counter-electrode lines via a contact hole between the counter electrode and the source driving circuit. Each of the counter-electrode lines has a second portion extending in a second direction intersecting the first direction from the contact hole to the signal input region within the frame region. The second portion crosses the source driving circuit and the inspection circuit in the second direction in a plan view (first configuration).

According to the first configuration, the counter-electrode lines cross the source driving circuit and the inspection circuit from the side of the pixel region of the active-matrix substrate with respect to the source driving circuit in the second direction (the direction intersecting the extension direction of the source line and extending from the contact hole to the signal input region). For this reason, a smaller intersection angle may result between the first direction and the second direction (the direction extending from the contact hole to the signal input region) than when the counter-electrode lines are formed in an edge region external to the source driving circuit toward the signal input region. As a result, an increase in an area having the counter-electrode lines thereon in the extension direction of the source line (the first direction) may be controlled if one counter-electrode line is spaced from another counter-electrode line. The frame region may thus be decreased in size even when the source driving circuit and the inspection circuit are arranged on the active-matrix substrate.

According to the first configuration, the inspection circuit may include an inspection transistor formed in the same layer as a layer where the pixel transistor is formed (second configuration).

According to the second configuration, the inspection transistor and the pixel transistor may be formed in the same manufacturing process.

According to one of the first and second configurations, the source driving circuit may include a first source driving region that outputs a source signal having a first polarity and a second source driving region that outputs a source signal having a second polarity inverse to the first polarity. The first source driving region and the second source driving region may be arranged in a direction perpendicular to the first direction. The source lines may include a plurality of first source lines arranged on a side of the first source driving region in the direction perpendicular to the first direction and a plurality of second source lines arranged on a side of the second source driving region in the direction perpendicular to the first direction. The source driving circuit may further include a first wiring connecting the first source driving region to one of the second source lines and a second wiring connecting the second source driving region to one of the first source lines. The counter-electrode lines may be formed in a layer different from a layer where the first wiring and the second wiring are formed (third configuration).

According to the third configuration, the counter-electrode line is formed in a layer different from a layer that includes the swap lines including the first wiring connecting the first source driving region to one of the second source lines and the second wiring connecting the second source driving region to one of the first source lines. Even when the swap lines are formed in the source driving circuit, the counter-electrode lines may be formed in the second direction without touching the swap lines. As a result, the frame region may be reduced in size if the swap lines are disposed in the source driving circuit.

According to the third configuration, at least a subset of the counter-electrode lines may be arranged to overlap at least one of the first wiring or the second wiring in a plan view (fourth configuration).

According to the fourth configuration, the area where the counter-electrode lines and the first and second wirings are arranged may be set to be smaller than when all the counter-electrode lines are arranged to be shifted in position from the first wiring and the second wiring.

A display device according to a fifth configuration may include the active-matrix substrate according to one of the first through fourth configurations and a counter substrate arranged opposite to the active-matrix substrate (fifth configuration).

The fifth configuration may provide the display device including the frame region that is reduced in size even when the source driving circuit and the inspection circuit are disposed on the active-matrix substrate.

A touch panel according to a sixth configuration includes a plurality of pixel electrodes arranged within a pixel region; a plurality of pixel transistors arranged within the pixel region; a plurality of source lines extending in a first direction within the pixel region with one of the source lines connected to one of the pixel transistors; a source driving circuit arranged within a frame region and supplying the source lines with a source signal; a plurality of touch-detecting electrodes overlapping at least one of the pixel electrodes in a plan view; a plurality of touch-detecting electrode lines having a first portion extending in the first direction within the pixel region with one of the touch-detecting electrode lines connected to one of the touch-detecting electrodes; a signal input region arranged within the frame region, supplying the touch-detecting electrode lines with a touch driving signal, and supplying the source driving circuit with a control signal; an inspection circuit arranged within the frame region and outputting an inspection signal used to inspect the touch-detecting electrodes; and a plurality of inspection lines connected to the inspection circuit and extending in the first direction within the frame region, wherein the source driving circuit and the inspection circuit are arranged between the counter electrodes and the signal input region, wherein the inspection lines are formed in a layer different from a layer where the touch-detecting electrode lines are formed, wherein each of the inspection lines is connected to one of the touch-detecting electrode lines via a contact hole between the touch-detecting electrode and the source driving circuit, wherein each of the touch-detecting electrode lines has a second portion extending in a second direction intersecting the first direction from the contact hole to the signal input region within the frame region, and wherein the second portion crosses the source driving circuit and the inspection circuit in the second direction in a plan view (sixth configuration).

The sixth configuration may provide the touch panel in which the frame region is reduced in size even when the source driving circuit and the inspection circuit are disposed on the active-matrix substrate.

The present disclosure contains subject matter related to that disclosed in Japanese Priority Patent Application JP 2023-051624 filed in the Japan Patent Office on Mar. 28, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An active-matrix substrate comprising:
 a plurality of pixel electrodes arranged within a pixel region;
 a plurality of pixel transistors arranged within the pixel region;
 a plurality of source lines extending in a first direction within the pixel region with one of the source lines connected to one of the pixel transistors;
 a source driving circuit arranged within a frame region and supplying the source lines with a source signal;
 a plurality of counter electrodes overlapping at least one of the pixel electrodes in a plan view;
 a plurality of counter-electrode lines having a first portion extending in the first direction within the pixel region with one of the counter-electrode lines connected to one of the counter electrodes;
 a signal input region arranged within the frame region, supplying the counter-electrode lines with a counter-electrode driving signal, and supplying the source driving circuit with a control signal;
 an inspection circuit arranged within the frame region and outputting an inspection signal used to inspect the counter electrodes; and
 a plurality of inspection lines connected to the inspection circuit and extending in the first direction within the frame region, wherein the source driving circuit and the inspection circuit are arranged between the counter electrodes and the signal input region, wherein the inspection lines are formed in a layer different from a layer where the counter-electrode lines are formed, wherein each of the inspection lines is connected to one of the counter-electrode lines via a contact hole between the counter electrode and the source driving circuit, wherein each of the counter-electrode lines has a second portion extending in a second direction intersecting the first direction from the contact hole to the signal input region within the frame region, and wherein the second portion crosses the source driving circuit and the inspection circuit in the second direction in a plan view.

2. The active-matrix substrate according to claim 1, wherein the inspection circuit comprises an inspection transistor formed in a layer identical to a layer where the pixel transistor is formed.

3. The active-matrix substrate according to claim 1, wherein the source driving circuit comprises a first source driving region that outputs a source signal having a first polarity and a second source driving region that outputs a source signal having a second polarity inverse to the first polarity, wherein the first source driving region and the second source driving region are arranged in a direction perpendicular to the first direction, wherein the source lines include a plurality of first source lines arranged on a side of the first source driving region in the direction perpendicular to the first direction and a plurality of second source lines arranged on a side of the second source driving region in the direction perpendicular to the first direction, and wherein the source driving circuit includes:
a first wiring connecting the first source driving region to one of the second source lines; and
a second wiring connecting the second source driving region to one of the first source lines; and wherein the counter-electrode lines are formed in a layer different from a layer where the first wiring and the second wiring are formed.

4. The active-matrix substrate according to claim 3, wherein at least a subset of the counter-electrode lines overlaps at least one of the first wiring or the second wiring in a plan view.

5. A display device comprising:
the active-matrix substrate according to claim 1; and
a counter substrate arranged opposite to the active-matrix substrate.

6. A touch panel comprising:
a plurality of pixel electrodes arranged within a pixel region;
a plurality of pixel transistors arranged within the pixel region;
a plurality of source lines extending in a first direction within the pixel region with one of the source lines connected to one of the pixel transistors;
a source driving circuit arranged within a frame region and supplying the source lines with a source signal;
a plurality of touch-detecting electrodes overlapping at least one of the pixel electrodes in a plan view;
a plurality of touch-detecting electrode lines having a first portion extending in the first direction within the pixel region with one of the touch-detecting electrode lines connected to one of the touch-detecting electrodes;
a signal input region arranged within the frame region, supplying the touch-detecting electrode lines with a touch driving signal, and supplying the source driving circuit with a control signal;
an inspection circuit arranged within the frame region and outputting an inspection signal used to inspect the touch-detecting electrodes; and
a plurality of inspection lines connected to the inspection circuit and extending in the first direction within the frame region, wherein the source driving circuit and the inspection circuit are arranged between the counter electrodes and the signal input region, wherein the inspection lines are formed in a layer different from a layer where the touch-detecting electrode lines are formed, wherein each of the inspection lines is connected to one of the touch-detecting electrode lines via a contact hole between the touch-detecting electrode and the source driving circuit, wherein each of the touch-detecting electrode lines has a second portion extending in a second direction intersecting the first direction from the contact hole to the signal input region within the frame region, and wherein the second portion crosses the source driving circuit and the inspection circuit in the second direction in a plan view.

* * * * *